(12) United States Patent
Winkler et al.

(10) Patent No.: US 8,894,870 B2
(45) Date of Patent: Nov. 25, 2014

(54) MULTI-STEP METHOD AND APPARATUS FOR ETCHING COMPOUNDS CONTAINING A METAL

(71) Applicant: ASM IP Holding B.V., Almere (NL)

(72) Inventors: Jereld Lee Winkler, Gilbert, AZ (US); Eric James Shero, Phoenix, AZ (US); Fred Alokozai, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/784,362

(22) Filed: Mar. 4, 2013

(65) Prior Publication Data

US 2014/0217065 A1     Aug. 7, 2014

Related U.S. Application Data

(60) Provisional application No. 61/759,990, filed on Feb. 1, 2013.

(51) Int. Cl.
| | | |
|---|---|---|
| *H01L 21/302* | (2006.01) | |
| *C23F 1/00* | (2006.01) | |
| *C23C 16/44* | (2006.01) | |
| *C23F 1/08* | (2006.01) | |

(52) U.S. Cl.
CPC ............... *C23C 16/4404* (2013.01); *C23F 1/00* (2013.01); *C23F 1/08* (2013.01)
USPC .......... 216/58; 216/63; 216/67; 216/75; 216/78; 216/79; 134/1.1; 134/22.1; 438/706; 438/710; 438/720; 438/734

(58) Field of Classification Search
None
See application file for complete search history.

(56) References Cited

U.S. PATENT DOCUMENTS

| | | | |
|---|---|---|---|
| 2,745,640 A | 5/1956 | Cushman | |
| 2,990,045 A | 9/1959 | Root | |
| 3,833,492 A | 9/1974 | Bollyky | |
| 3,854,443 A | 12/1974 | Baerg | |
| 3,862,397 A | 1/1975 | Anderson et al. | |
| 3,887,790 A | 6/1975 | Ferguson | |
| 4,058,430 A | 11/1977 | Suntola et al. | |
| 4,176,630 A | 12/1979 | Elmer | |
| 4,194,536 A | 3/1980 | Stine et al. | |

(Continued)

FOREIGN PATENT DOCUMENTS

| | | |
|---|---|---|
| CN | 1563483 A | 1/2005 |
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — Anita Alanko
(74) *Attorney, Agent, or Firm* — Snell & Wilmer LLP

(57) ABSTRACT

A system and method for etching a material, including a compound having a formulation of XYZ, wherein X and Y are one or more metals and Z is selected from one or more Group 13-16 elements, such as carbon, nitrogen, boron, silicon, sulfur, selenium, and tellurium, are disclosed. The method includes a first etch process to form one or more first volatile compounds and a metal-depleted layer and a second etch process to remove at least a portion of the metal-depleted layer.

20 Claims, 3 Drawing Sheets

(56) References Cited

U.S. PATENT DOCUMENTS

| | | |
|---|---|---|
| 4,389,973 A | 6/1983 | Suntola et al. |
| 4,393,013 A | 7/1983 | McMenamin |
| 4,436,674 A | 3/1984 | McMenamin |
| 4,570,328 A | 2/1986 | Price et al. |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,991,614 A | 2/1991 | Hammel |
| 5,062,386 A | 11/1991 | Christensen |
| 5,167,716 A | 12/1992 | Boitnott et al. |
| 5,199,603 A | 4/1993 | Prescott |
| 5,221,556 A | 6/1993 | Hawkins et al. |
| 5,243,195 A | 9/1993 | Nishi |
| 5,380,367 A | 1/1995 | Bertone |
| 5,595,606 A | 1/1997 | Fujikawa et al. |
| 5,632,919 A | 5/1997 | MacCracken et al. |
| 5,730,801 A | 3/1998 | Tepman |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,855,680 A | 1/1999 | Soininen et al. |
| 5,979,506 A | 11/1999 | Aarseth |
| 6,013,553 A | 1/2000 | Wallace |
| 6,015,465 A | 1/2000 | Kholodenko et al. |
| 6,060,691 A | 5/2000 | Minami et al. |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,161,500 A | 12/2000 | Kopacz et al. |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,569,239 B2 | 5/2003 | Arai et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,648,974 B1 | 11/2003 | Ogliari et al. |
| 6,682,973 B1 | 1/2004 | Paton et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shipley et al. |
| 6,847,014 B1 | 1/2005 | Benjamin et al. |
| 6,858,547 B2 | 2/2005 | Metzner et al. |
| 6,875,677 B1 | 4/2005 | Conley, Jr. et al. |
| 6,884,066 B2 | 4/2005 | Nguyen et al. |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,312,494 B2 | 12/2007 | Ahn et al. |
| 7,329,947 B2 | 2/2008 | Adachi et al. |
| 7,357,138 B2 * | 4/2008 | Ji et al. ......................... 134/22.1 |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow et al. |
| 7,437,060 B2 | 10/2008 | Wang et al. |
| 7,442,275 B2 | 10/2008 | Cowans |
| 7,489,389 B2 | 2/2009 | Shibazaki |
| 7,547,363 B2 | 6/2009 | Tomiyasu et al. |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| D614,153 S | 4/2010 | Fondurulia et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,851,019 B2 | 12/2010 | Tuominen et al. |
| 7,884,918 B2 | 2/2011 | Hattori |
| 8,041,197 B2 | 10/2011 | Kasai et al. |
| 8,071,451 B2 | 12/2011 | Berry |
| 8,071,452 B2 | 12/2011 | Raisanen |
| 8,072,578 B2 | 12/2011 | Yasuda |
| 8,076,230 B2 | 12/2011 | Wei |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,278,176 B2 | 10/2012 | Bauer et al. |
| 8,282,769 B2 | 10/2012 | Iizuka |
| 8,293,016 B2 | 10/2012 | Bahng et al. |
| 8,309,173 B2 | 11/2012 | Tuominen et al. |
| 8,367,528 B2 | 2/2013 | Bauer et al. |
| 8,608,885 B2 | 12/2013 | Goto et al. |
| 8,683,943 B2 | 4/2014 | Onodera et al. |
| 8,711,338 B2 | 4/2014 | Liu et al. |
| 8,726,837 B2 | 5/2014 | Patalay et al. |
| 2002/0001974 A1 | 1/2002 | Chan |
| 2002/0064592 A1 | 5/2002 | Datta et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0111963 A1 | 6/2003 | Tolmachev et al. |
| 2003/0141820 A1 | 7/2003 | White et al. |
| 2003/0228772 A1 | 12/2003 | Cowans |
| 2003/0232138 A1 | 12/2003 | Tuominen et al. |
| 2004/0013577 A1 | 1/2004 | Ganguli et al. |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0219793 A1 | 11/2004 | Hishiya et al. |
| 2005/0008799 A1 | 1/2005 | Tomiyasu et al. |
| 2005/0019026 A1 | 1/2005 | Wang et al. |
| 2005/0020071 A1 * | 1/2005 | Sonobe et al. .................. 438/689 |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |

(56) References Cited

U.S. PATENT DOCUMENTS

| | | |
|---|---|---|
| 2005/0092249 A1 | 5/2005 | Kilpela et al. |
| 2005/0100669 A1 | 5/2005 | Kools et al. |
| 2005/0110069 A1 | 5/2005 | Kil et al. |
| 2005/0173003 A1 | 8/2005 | Laverdiere et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0022954 A1 | 2/2007 | Iizuka et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054405 A1 | 3/2007 | Jacobs et al. |
| 2007/0059948 A1 | 3/2007 | Metzner et al. |
| 2007/0065578 A1* | 3/2007 | McDougall ............... 427/248.1 |
| 2007/0066010 A1 | 3/2007 | Ando |
| 2007/0077355 A1 | 4/2007 | Chacin et al. |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0252244 A1 | 11/2007 | Srividya et al. |
| 2007/0264807 A1* | 11/2007 | Leone et al. ............... 438/507 |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2009/0011608 A1 | 1/2009 | Nabatame |
| 2009/0020072 A1 | 1/2009 | Mizunaga et al. |
| 2009/0061644 A1 | 3/2009 | Chiang et al. |
| 2009/0085156 A1 | 4/2009 | Dewey et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0124610 A1 | 5/2010 | Aikawa et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0256734 A1 | 10/2011 | Hausmann et al. |
| 2011/0275166 A1 | 11/2011 | Shero et al. |
| 2012/0090704 A1 | 4/2012 | Laverdiere et al. |
| 2012/0098107 A1 | 4/2012 | Raisanen et al. |
| 2012/0160172 A1 | 6/2012 | Wamura et al. |
| 2012/0240858 A1 | 9/2012 | Taniyama et al. |
| 2012/0295427 A1 | 11/2012 | Bauer |
| 2012/0304935 A1 | 12/2012 | Oosterlaken et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0014644 A1 | 1/2014 | Akiba et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |

FOREIGN PATENT DOCUMENTS

| | | |
|---|---|---|
| CN | 101423937 | 9/2011 |
| JP | 07283149 | 10/1995 |
| JP | 08335558 | 12/1996 |
| JP | 2001342570 | 12/2001 |
| JP | 2004014952 A | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | 200701301 A | 1/2007 |
| WO | 2006056091 A1 | 6/2006 |
| WO | 2006/078666 | 7/2006 |

OTHER PUBLICATIONS

USPTO; Office Action dated Feb. 15, 2011 in U.S. Appl. No. 12/118,596.

USPTO; Notice of Allowance dated Aug. 4, 2011 in U.S. Appl. No. 12/118,596.

USPTO; Notice of Allowance dated Jun. 16, 2011 in U.S. Appl. No. 12/430,751.

(56) References Cited

OTHER PUBLICATIONS

USPTO; Notice of Allowance dated Jul. 27, 2011 in U.S. Appl. No. 12/430,751.
USPTO; Office Action dated Apr. 23, 2013 in U.S. Appl. No. 12/763,037.
USPTO; Office Action dated Jan. 15, 2013 in U.S. Appl. No. 12/754,223.
USPTO; Office Action dated Feb. 26, 2013 in U.S. Appl. No. 12/754,223.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 is Serial No. 201080015699.9.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea, available electronically Mar. 7, 2008.
Novaro et al. Theoretical Study on a Reaction Pathway of Ziegler-Natta-Type Catalysis, J. Chem. Phys. 68(5), Mar. 1, 1978 p. 2337-2351.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
Chinese Patent Office; Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Dec. 25, 2014 in Serial No. 2012-504786.
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.

\* cited by examiner

MULTI-STEP METHOD AND APPARATUS FOR ETCHING COMPOUNDS CONTAINING A METAL

CROSS REFERENCE TO RELATED APPLICATION

This application claims the right of priority based on U.S. Provisional Patent Application No. 61/759,990 entitled "METHOD AND SYSTEM FOR TREATMENT OF DEPOSITION REACTOR" filed on Feb. 1, 2013, which is incorporated herein by reference, to the extent it does not conflict with the present disclosure.

FIELD OF INVENTION

The disclosure generally relates to methods and systems for etching or removing materials. More particularly, exemplary embodiments of the present disclosure relate to methods and systems for multi-step removal of compounds containing two or more metals.

BACKGROUND OF THE DISCLOSURE

Doped metal compounds, having a formula XYZ, wherein X and Y are one or more metals and Z is selected from one or more Group 13-16 elements, such as carbon, nitrogen, boron, silicon, sulfur, selenium, and tellurium, such as aluminum-doped metal carbide, may be used for a variety of applications. For example, aluminum-doped titanium carbide and similar materials may be used for gate electrodes in metal oxide field effect transistors (MOSFETs) or insulated gated field effect transistors (IGFETs), such as complementary metal oxide semiconductor (CMOS) devices, as a barrier layer or fill material for semiconductor or similar electronic devices, or as coatings in other applications.

When used as a layer of an electronic device or as a coating, the doped metal films are typically deposited using gas-phase deposition techniques, such as sputtering, chemical vapor deposition, or atomic layer deposition. As the number of deposition runs in a reactor increases, residue of the doped metal films may form in the reactor. As the residue of material increases within the reactor, the quality of the film deposited in the reactor may degrade—e.g., particles may form in the deposited film. To prevent or mitigate this degradation in film quality, the reactor may be periodically cleaned to remove the residue.

A typical clean process for a gas-phase reactor includes providing a gas-phase reactant that reacts with the residue material to be removed to form a more volatile compound. Unfortunately, gases, such as fluorine or other halide or halogen based etch chemistries that may be used to remove metal compounds may react to with constituents of the residue to form relatively nonvolatile compounds. For example, when fluorine is used to etch or remove aluminum doped metal carbide residue, the fluorine reacts with the aluminum to form aluminum fluoride, which is relatively nonvolatile. The aluminum fluoride material therefore acts as an etch barrier to removal of the residue.

Accordingly, improved methods and systems for etching or removing material having a formula XYZ, wherein X and Y are one or more metals and Z is selected from one or more Group 13-16 elements, such as carbon, nitrogen, boron, silicon, sulfur, selenium, and tellurium, are desired.

SUMMARY OF THE DISCLOSURE

Various embodiments of the present disclosure provide an improved method and system for etching or removing material having a formula XYZ, wherein X and Y are one or more metals and Z is selected from one or more Group 13-16 elements, such as carbon, nitrogen, boron, silicon, sulfur, selenium, and tellurium. While the ways in which the various drawbacks of the prior art are discussed in greater detail below, in general, the method and system use a multi-step etch process to remove the material by exposing the material to a first etch chemistry to form one or more first volatile compound(s) and a nonvolatile, metal-depleted compound, removing the first volatile compound(s), optionally repeating these exposing and removing steps for a desired number of times, and then exposing the metal-depleted material to a second etch chemistry to form one or more second volatile compound(s), removing the second volatile compound(s), and repeating the steps until a desired amount of the material is removed. The system and method mitigate formation of material that might serve as an etch stop to material removal and reduce damages to a reactor during the etch process that might otherwise occur. The method and system may be used to clean a deposition or etch reactor and/or remove a portion of a layer comprising the material.

In accordance with various embodiments of the disclosure, a method of etching the material includes the steps of exposing the material to a first etch chemistry (e.g., one or more of chlorine, bromine, iodine, molecules comprising chlorine, molecules comprising bromine, molecules containing iodine, molecules comprising chlorine ions, molecules comprising bromine ions, molecules comprising iodine ions, radicals comprising chlorine, radicals comprising bromine, radical comprising iodine, thermally activated molecules comprising chlorine, thermally activated molecules comprising bromine, thermally activated molecules comprising iodine, plasma activated molecules comprising chlorine, plasma activated molecules comprising bromine, plasma activated molecules comprising iodine, and any combinations thereof) to react with the material to form one or more first volatile compounds and a nonvolatile material; removing the first volatile compound(s), optionally repeating the exposing the material to a first etch chemistry and the removing the first volatile compound(s) steps for a desired number of times to remove and/or treat the material, and then exposing the nonvolatile (metal-depleted) material to a second etch chemistry (e.g., selected from the group consisting of one or more of fluorine, molecules comprising fluorine, molecules comprising a fluorine ion, radicals comprising fluorine, and any combinations thereof) to form one or more second volatile compounds:, and removing the second volatile compound(s). In accordance with exemplary aspects of the disclosure, the method includes repeating the exposing the material to a first etch chemistry, removing the first volatile compound(s), optionally repeating the exposing the material to a first etch chemistry and the removing the first volatile compound(s) steps for a desired number of times to remove and/or treat the material, exposing the metal-depleted material to a second etch chemistry to form second volatile compound(s), and removing the second volatile compound(s), until a desired amount of the material is removed. In accordance with various aspects of these embodiments, the step of exposing the material to a first etch chemistry is performed for a predetermined amount of time. In accordance with additional aspects, the step of exposing the material to a first etch chemistry is performed until an endpoint is detected. In accordance with yet further aspects, the step of exposing the material to a second etch chemistry is performed for a predetermined amount of time or until an endpoint is detected. In accordance with yet further aspects of these embodiments, the method is used for in situ cleaning of a reactor after deposition of the material. In accordance with yet further aspects, the method is used to etch a layer of the material.

In accordance with further exemplary embodiments of the disclosure, a system for etching the material includes a gas-phase reaction chamber having the material therein, a first etch reactant source comprising a first etch reactant (e.g., selected from the group consisting of molecules including one or more of chlorine, bromine, and iodine), coupled to the reaction chamber, a second reactant source comprising a second reactant (e.g., comprising fluorine) coupled to the reaction chamber, and one or more purge gasses coupled to the reactor. In accordance with various aspects of these embodiments, the system is configured to expose the material to a first etch chemistry derived from the first etch reactant source to form one or more first volatile compounds and a metal-depleted material, remove the first volatile compound(s) (e.g., using a vacuum and/or the one or more purge gasses), optionally repeat the expose the material to a first etch chemistry and the remove the first volatile compound(s) steps for a desired number of times, and then expose the metal-depleted material to a second etch chemistry derived from the second etch reactant source to form one or more second volatile compounds, remove the second volatile compound(s), and optionally repeat the expose the material to a first etch chemistry, remove the first volatile compound(s), expose the metal-depleted material, and remove the second volatile compound(s) steps until a desired amount of the material is removed. In accordance with further aspects, the system includes an apparatus to thermally activate the first and/or second etch reactants. In accordance with further aspects, the system includes a remote and/or direct plasma to plasma activate the first and/or second etch reactants. In accordance with further aspects, the system includes an endpoint detector to determine when a desired amount of the material or metal-depleted material is removed. In accordance with various aspects of these embodiments, the reaction chamber is a physical vapor deposition (PVD), chemical vapor deposition (CVD), and/or atomic layer deposition (ALD) reaction chamber.

Both the foregoing summary and the following detailed description are exemplary and explanatory only and are not restrictive of the disclosure or the claimed invention.

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION OF EXEMPLARY EMBODIMENTS OF THE DISCLOSURE

The description of exemplary embodiments of a method and system provided below is merely exemplary and is intended for purposes of illustration only; the following description is not intended to limit the scope of the disclosure. Moreover, recitation of multiple embodiments having stated features is not intended to exclude other embodiments having additional features or other embodiments incorporating different combinations of the stated features.

The method and system described herein can be used to remove material having a general formula XYZ, wherein X and Y represent one or more metals and Z is selected from one or more Group 13-16 elements, such as carbon, nitrogen, boron, silicon, sulfur, selenium, and tellurium. In accordance with exemplary embodiments of the invention, X includes or is a Group 13-16 metal or transition metal, such as a metal selected from the group consisting of aluminum, boron, and gallium, and Y includes or is a Group 13-16 metal or transition metal, such as a metal selected from the group consisting of titanium and tantalum. Although illustrated with just three components: X, Y, and Z, the materials having the general formula of XYZ, as described herein, may include additional metals and/or additional elements selected from Periods 2-3 and Groups 13-17 of the Periodic Table.

Figure 1:
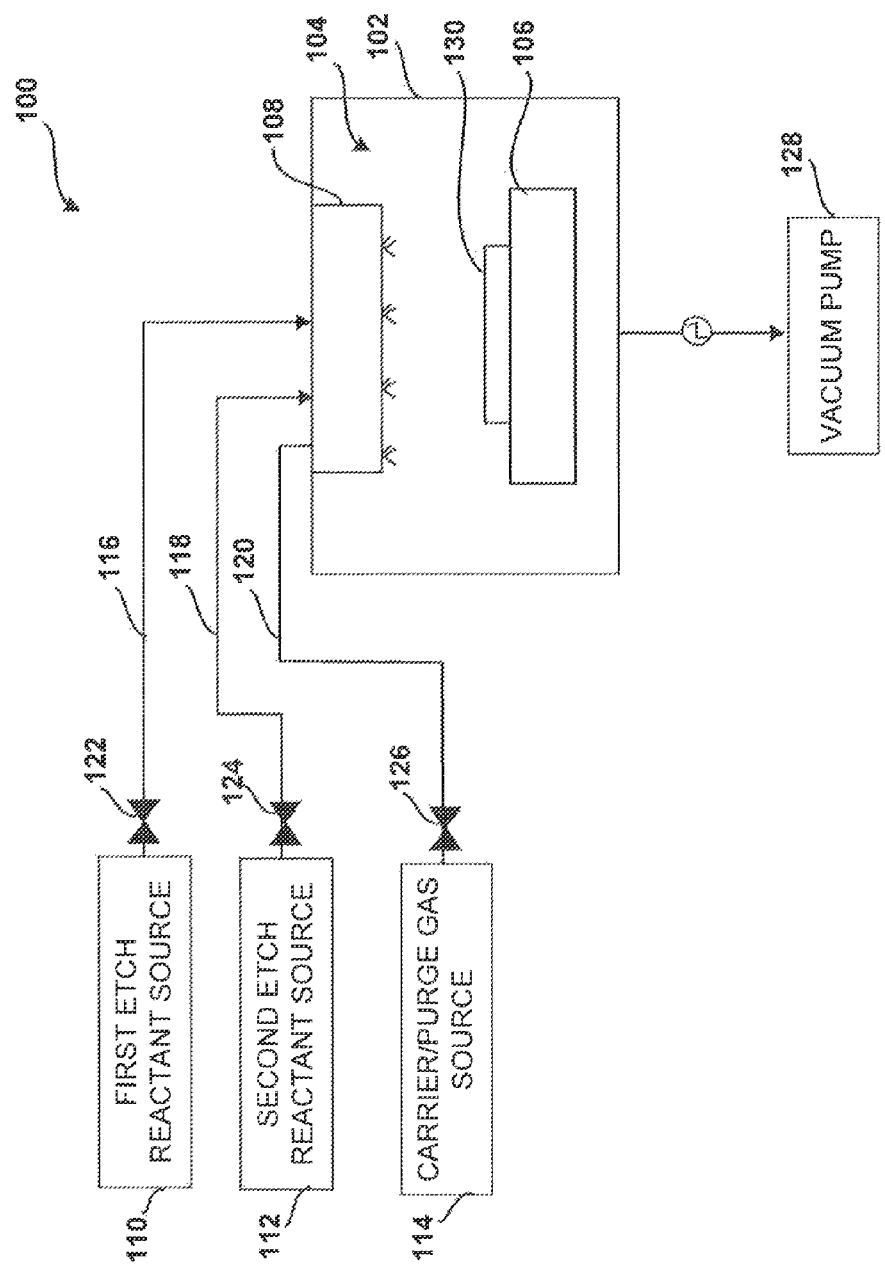
FIG. 1 illustrates a system in accordance with various exemplary embodiments of the disclosure.

Turning now to FIG. 1, a system 100, for removing XYZ material, as described herein, is illustrated. System 100 includes a reactor 102, including a reaction chamber 104, a substrate holder 106, and a gas distribution system 108; a first etch reactant source 110; a second etch reactant source 112; a carrier or purge gas source 114; lines 116, 118, 120 connecting sources 110-114 to reactor 102; valves 122, 124 and 126 interposed between the sources 110-114 and reactor 102; and a vacuum pump 128.

Reactor 102 may be a standalone reactor or part of a cluster tool. Further, reactor 102 may be dedicated to XYZ material deposition and/or removal processes as described herein, or reactor 102 may be used for other processes—e.g., for other layer deposition and/or etch processing. For example, reactor 102 may include a reactor typically used for physical vapor deposition (PVD), chemical vapor deposition (CND), and/or atomic layer deposition (ALD) processing, and may include thermal excitation, direct plasma, and/or remote plasma apparatus. Using thermal or plasma activation apparatus during an etch process may enhance the reactivity of the etch reactants from sources 110, 112. By way of one example, reactor 102 includes a reactor suitable for AID deposition. An exemplary ALD reactor suitable for system 100 is described in U.S. Pat. No. 8,152,922 to Schmidt et al., issued Apr. 10, 2012, entitled. "Gas Mixer and Manifold Assembly for ALD Reactor," the contents of which are hereby incorporated herein by reference, to the extent such contents do not conflict with the present disclosure.

Substrate holder 106 is designed to hold a substrate or workpiece 130 in place during processing. In accordance with various exemplary embodiments, holder 106 may form part of a direct plasma circuit. Additionally or alternatively, holder 106 may be heated, cooled, or be at ambient process temperature during processing.

Although gas distribution system 108 is illustrated in block form, gas distribution system 108 may be relatively complex and designed to mix vapor (gas) from sources 110 and/or 112 and carrier/purge gas from one or more sources, such as gas source 114, prior to distributing the gas mixture to remainder of reactor 102. Further, system 108 may be configured to provide vertical (as illustrated) or horizontal flow of gasses to the chamber 104. An exemplary gas distribution system is described in U.S. Pat. No. 8,152,922.

First etch reactant source 110 includes one or more gases, or materials that become gaseous, that react with or form reactive species that react with the material to form one or more first volatile substances (e.g., comprising X and/or Y) and a less volatile, metal-depleted material (e.g., comprising Z and/or one or more components of the first etch reactant source). Source 110 may include, for example, chlorine, bromine, iodine or molecules comprising chlorine, bromine and/or iodine. Gas from source 110 may be exposed to a thermal and/or remote plasma and/or direct plasma source to form activated species, such as ions and/or radicals including one or more of chlorine, bromine, and iodine. By way of specific examples, first etch reactant source 110 includes chlorine and/or boron tribromide.

When reactor 102 includes aluminum parts within chamber 104, it may be desirable to use a bromine based source, such as $BBr_3$, rather than a chlorine-based source, because the etch chemistry may be more efficient and bromine chemistries may exhibit a better selectivity to $Al_2O_3$, compared to chlorine based etch chemistries. Thus, reactor components with an aluminum oxide coating may be better protected when using bromine-based etch chemistries, compared to chlorine-based etch chemistries.

Second source 112 includes one or more gases, or materials that become gaseous, that react with or form reactive species that react with the metal-depleted material to form one or more second volatile substances ((e.g., substances comprising Z and/or a component of the first etch reactant source, such as Cl or Br). The reactive species from second source 112 may also remove remaining material comprising X and/or Y. Source 112 may include, for example, fluorine or molecules including fluorine. Gas from source 112 may be exposed to a thermal and/or direct plasma source and/or a remote plasma source to form activated species, such as ions and/or radicals including fluorine.

Carrier or inert source 114 includes one or more gases, or materials that become gaseous, that are relatively unreactive in reactor 102. Exemplary carrier and inert gasses include nitrogen, argon, helium, and any combinations thereof.

Figure 2:
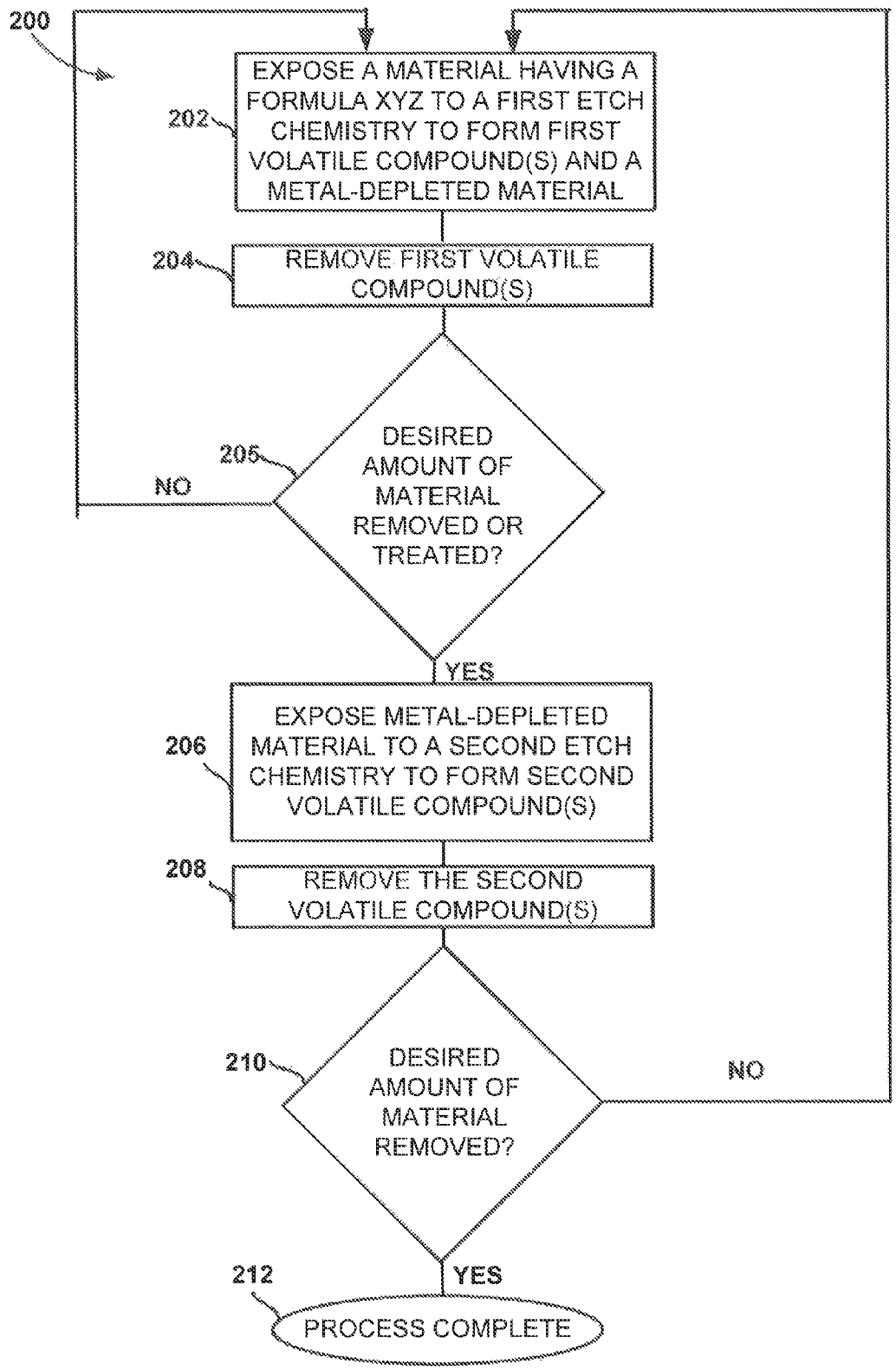
FIG. 2 illustrates a method in accordance with exemplary embodiments of the disclosure.
Figure 3:
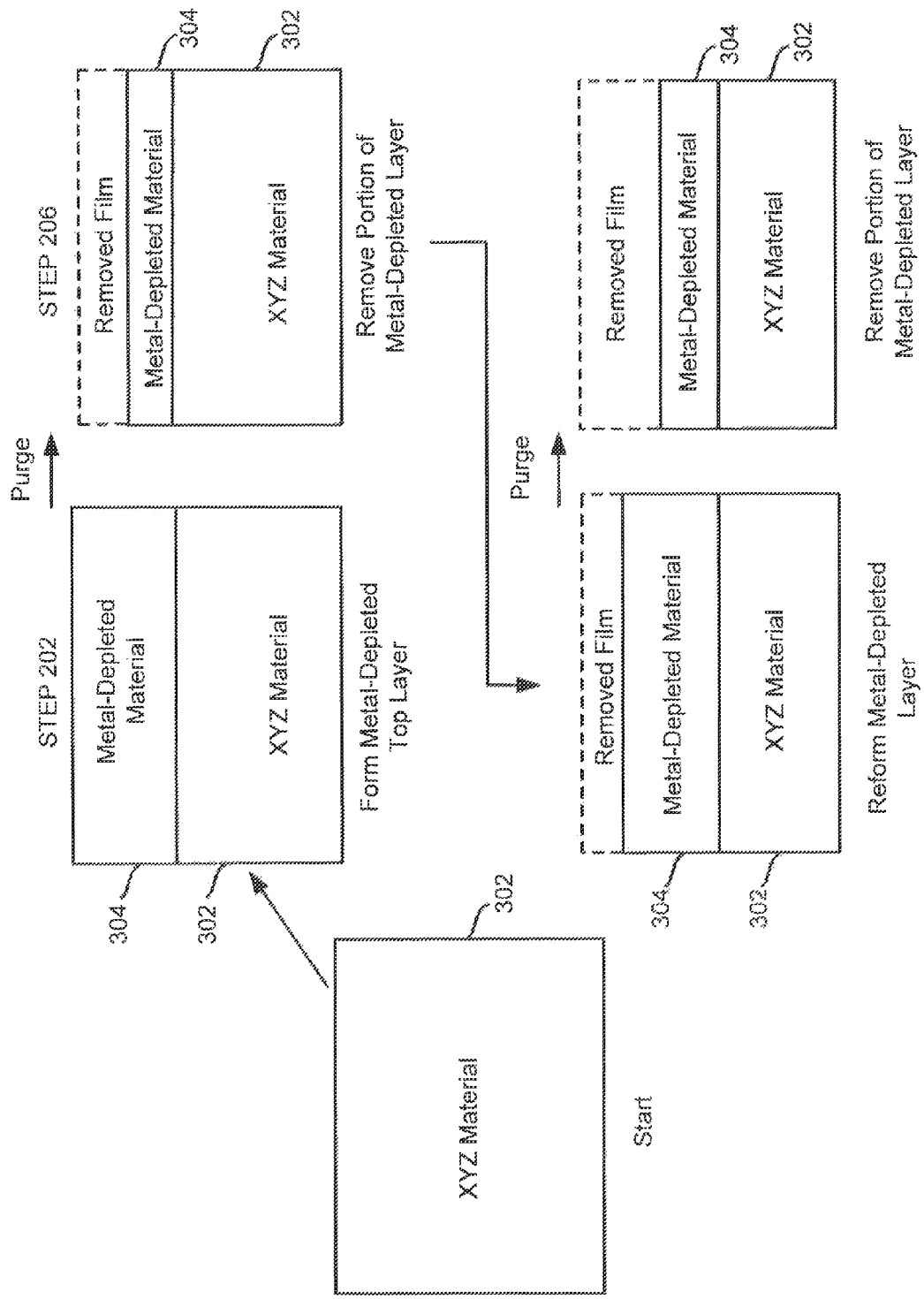
FIG. 3 illustrates material removal steps in accordance with exemplary embodiments of the disclosure.

FIG. 2 illustrates a method 200 of etching or removing a material and FIG. 3 illustrates XYZ material 302 as material 302 is being etched. Method 200 includes the steps of: in a reaction chamber, exposing a material, having a formula XYZ to a first etch chemistry to form one or more first volatile compounds and a metal-depleted material (step 202), removing the first volatile compound(s) from the reaction chamber (step 204), determining whether a desired amount of material is treated or removed (step 205), and if the desired amount of material has not been treated or removed, repeating steps 202 and 204, and if the desired amount of material has been removed or treated, exposing the metal-depleted material to a second etch chemistry to form one or more second volatile compounds (step 206), removing the second volatile compound(s) (step 208), determining whether a desired amount of material (e.g., the XYZ material) is removed (step 210), and if the desired amount of material is not removed, repeating steps 202-208, and if the desired amount of material is removed, the process is complete (step 212). As set forth in more detail below, it may be desirable to not completely remove the XYZ layer in the first cycle of steps 202-208, but rather to complete at least two cycles of steps 202-208 of method 200.

In accordance with exemplary embodiments of the disclosure, the first etch chemistry reacts with the XYZ material to form one or more volatile compounds comprising X and/or Y metal and a nonvolatile metal-depleted material including the Z and/or a component of the first etch chemistry; and the second etch chemistry is used to remove at least part of the metal-depleted layer. Using the two-step process described herein allows removal of otherwise difficult to etch films, while mitigating damage to reactor parts that might otherwise occur using a single-step etch process. For example, when the XYZ material includes aluminum, using a fluorine-based etch chemistry in the first or in a single etch step causes aluminum fluoride to form, which is relatively nonvolatile, and once formed, is very difficult to remove. Aluminum fluoride is solid up to about 1291° C. and has a low vapor pressure at typical reactor 102 operating temperatures. Similarly, using a chlorine-based etch chemistry in single etch step may cause aluminum in the reactor itself to be etched. However, use of a first etch chemistry may he repeated several times before a second etch chemistry is used. The illustrative example of using a two-step process described herein mitigates formation of such nonvolatile fluorine compounds and also reduces or prevents etching of aluminum reactor components.

Step 202 includes exposing XYZ material 302 to a halogen-based etch chemistry, exclusive of fluorine-based etch chemistry, to form one or more first compounds that are relatively volatile and a metal-depleted compound 304 that is relatively nonvolatile. The nonvolatile, metal-depleted compound may include Z, which is selected from one or more of carbon, nitrogen, boron, silicon, sulfur, selenium, and tellurium and/or a compound from the etch chemistry. The metal-depleted compound may also include X and/or Y. in this context, relatively volatile means the compound has a vapor pressure greater than or equal to 0.5 or 1 Torr at 150° C. and relatively nonvolatile means the compound has a vapor pressure less than 0.5 or 1 Torr at 150° C. For example, the first etch chemistry may be used to remove relatively volatile X (e.g., aluminum) and Y (e.g., tantalum and/or titanium) compounds from the XYZ material to leave relatively nonvolatile metal-depleted material (e.g., comprising Z and or a product of Z and a component of the first etch chemistry) remaining.

During step 202, material 302 is exposed to a first etch chemistry that includes a gas, radical, ion, or reactive species comprising a halogen (exclusive of fluorine) moiety. By way of example, the first etch chemistry includes one or more of chlorine, bromine, iodine, molecules comprising chlorine, molecules comprising bromine, molecules containing iodine, molecules comprising chlorine ions, molecules comprising bromine ions, molecules comprising iodine ions, radicals comprising chlorine, radicals comprising bromine, radical comprising iodine, thermally activated molecules comprising chlorine, thermally activated molecules comprising bromine, thermally activated molecules comprising iodine, plasma activated molecules comprising chlorine, plasma activated molecules comprising bromine, plasma activated molecules comprising iodine, and any combinations thereof.

The first etch chemistry may he derived from first etch reactant source 110. The first etch reactant source 110 may be exposed to a thermal or plasma activation process to form ions, radical, or other activated species. For example, first etch reactant source may include chlorine gas, or a gas including chlorine, and the first etch chemistry may include chlorine gas (or gas including chlorine), chlorine ions, molecules including chlorine ions, molecules including chlorine radicals, and other chlorine activated species. Further, source 110 may include a plurality of etch reactant compounds, any with various forms and combinations of gasses, ions, radicals, and other activated species. For example, the first etch chemistry may include a combination of molecules, radicals and/or ions including chlorine and/or molecules, radicals, and/or ions including bromine.

In accordance with various exemplary aspects of this disclosure, step 202 is configured such that the first etch chemistry does not penetrate or react with the entire XYZ material, as illustrated in FIG. 3. In other words, step 202 may be stopped or may be self-limiting, such that not all of material 302 reacts with the first etch chemistry, such that the second etch chemistry, in step 206, can be used to remove at least part of layer 304 that forms during step 202. As noted above, terminating step 202, during the first cycle, prior to the first etch chemistry reacting with the entire XYZ material, may mitigate reactor damage that might otherwise occur.

Step 202 may be terminated based on an endpoint, e.g., after a peak concentration versus time is detected, terminated based on an amount of material removed, based on a set amount of time, or similar factors. By way of example, when the material includes aluminum titanium carbide and the first etch chemistry is chlorine-based, the penetration depth of the first etch chemistry is thought to be about 0.1 to about 0.2 microns, and may be self-limiting to that depth of material 302.

During step 204, the volatile material(s) formed during step 202 are removed from the material and from the reaction chamber. Although illustrated as a separate step, removal of the first volatile compound(s) may occur as the first etch chemistry reacts with the material to form the first volatile compound(s). A reactor (e.g., reactor 102) may also be purged after the completion of step 202 to facilitate the removal of the first volatile compound(s) from the reactor.

During a purge, a suitable amount of inert gas, such as nitrogen, argon, helium, and any combinations thereof flows through the reactor to remove the first volatile compound(s) and the first etch chemistry.

If a desired amount of material has been treated during steps 202-204, method 200 proceeds to step 206. If on the other hand, a desired amount of material has not been treated, steps 202-304 may be repeated. Although step 205 is illustrated as a decision, steps 202-204 may be repeated after one or more deposition runs, after a desired number of substrates have been processed, and/or based on statistical process control parameters, before method 200 proceeds to step 206. By way of one example, it is thought that exposing XYZ material in a deposition chamber of a reactor to the first etch chemistry (e.g., thermally activated chlorine) after one or more runs mitigates buildup of the XYZ material within the deposition reactor, particularly at a showerhead or distribution system (e.g., system 108). By way of further example, the treatment of the reactor with steps 202-204 is thought to remove "low temperature" XYZ material, which may form at temperature less than about 250° C., and then all steps 202-208 may be used to remove "high temperature" XYZ material, which is formed at temperatures greater than about 250° C. The high temperature XYZ material may form, for example around a susceptor of a reactor, and the low temperature XYZ material may form elsewhere in the reactor—e.g., in and around the showerhead and elsewhere in the reaction chamber.

After the purge step, material layer 304 is exposed to a second etch chemistry (step 206) that includes a gas, radical, ion, and/or reactive species comprising a fluorine moiety. By way of examples, the second etch chemistry includes fluorine, molecules comprising fluorine, molecules comprising a fluorine ion, radicals comprising fluorine, and any combinations thereof.

The second etch chemistry may be derived from second etch reactant source 112. The second etch reactant source 112 may be exposed to a thermal or plasma activation process to form ions, radical, or other activated species. For example, second etch reactant source may include fluorine gas, or a gas including fluorine, and the second etch chemistry may include fluorine gas (or gas including fluorine), fluorine ions or molecules including fluorine ions, molecules including fluorine radicals, and other fluorine activated species. Further, source 112 may include a plurality of etch reactant compounds, any with various forms and combinations of gasses, ions, radicals, and other activated species.

In accordance with various exemplary aspects of this disclosure, at least the first cycle of step 206 is configured such that the second etch chemistry does not penetrate or react with the entire material layer 304. In other words, step 206 is stopped, self-limiting, or otherwise designed, such that not all of layer 304 reacts with the second etch chemistry. By way of specific examples, step 206 is configured to remove about one half or about three quarters of metal-depleted layer 304. Step 206 may be terminated based on an endpoint, e.g., after a peak concentration versus time is detected, terminated based on an amount of material removed, based on a set amount of time, or similar factors. Stopping at least the first cycle of step 206 prior to allowing the second etch chemistry to react with the entire metal-depleted material layer mitigates formation of low volatile materials, such as aluminum fluoride, which would be difficult to remove.

During step 208, the second volatile compound(s) are removed. The second volatile compound(s) may be removed as the second etch chemistry reacts with layer 304, and the removal may be facilitated by a subsequent purge step, using, e.g., a nitrogen, argon, helium, or a combination thereof, purge process.

During step 210, a determination is made whether a desired amount of material is removed. Step 210 may be based on, for example, an estimated amount of material to be removed, estimated etch rates, time, endpoint detection, process control parameters, or similar parameters.

Although step 210 is illustrated as a decision or determination, method 200 may be configured to automatically run a predetermined number of cycles of steps 202-208. For example, method 200 may be configured to run 1, 2, 3, 4, 5, 10 number of cycles and complete (step 212) upon the conclusion of step 208 of the last cycle.

When used as a deposition reactor cleaning process, method 200 may be run after a predetermined number of runs—e.g., after every run, after five runs, or the like; after a predetermined amount of material buildup—e.g., greater than about one micron or greater than about five microns total film accumulation; based on statistical process control film quality (e.g., particle formation); or similar parameters. Similarly, steps 202-204 may be run after a predetermined number of runs—e.g., after every run, after five runs, or the like; after a predetermined amount of material buildup e.g.,—greater than about one micron or greater than about five microns total film accumulation; based on statistical process control film quality (e.g., particle formation); or similar parameters prior to method 200 proceeding to step 206.

Although exemplary embodiments of the present disclosure are set forth herein, it should be appreciated that the disclosure is not so limited. For example, although the system and method are described in connection with various specific materials, the disclosure is not necessarily limited to these materials. Various modifications, variations, and enhancements of the system and method set forth herein may be made without departing from the spirit and scope of the present disclosure.

What is claimed is:

1. A method of etching material, the method comprising the steps of:
   in a reaction chamber, exposing a material comprising a formula XYZ, wherein X comprises a metal selected from the group consisting of Group 13-16 metals and transition metals, Y comprises a metal selected from the group consisting of Group 13-16 metals and transition metals, and Z is selected from one or more Group 13-16 elements, to a first etch chemistry to form one or more first volatile compounds and a metal-depleted material;

removing the one or more first volatile compounds from the reaction chamber;

exposing the metal-depleted material to a second etch chemistry to react with the metal-depleted material to form one or more second volatile compounds; and removing the one or more second volatile compound.

2. The method of claim 1, wherein X comprises a metal selected from the group consisting of aluminum, boron, and gallium.

3. The method of claim 1, wherein Y comprises a metal selected from the group consisting of titanium and tantalum.

4. The method of claim 1, wherein X is aluminum and Y is titanium.

5. The method of claim 1, further comprising repeating the steps of exposing a material, removing the one or more first volatile compounds, exposing the metal-depleted material to a second etch chemistry, and removing the one or more second volatile compounds, until a desired amount of the material is removed.

6. The method of claim 1, wherein the first etch chemistry is derived from an etch reactant comprising one or more of chlorine, bromine, iodine, molecules including chlorine, molecules including bromine, molecules including iodine, or any combination thereof.

7. The method of claim 1, wherein the first etch chemistry comprises one or more of chlorine, bromine, iodine, molecules comprising chlorine, molecules comprising bromine, molecules containing iodine, molecules comprising chlorine ions, molecules comprising bromine ions, molecules comprising iodine ions, radicals comprising chlorine, radicals comprising bromine, radicals comprising iodine, thermally activated molecules comprising chlorine, thermally activated molecules comprising bromine, thermally activated molecules comprising iodine, plasma activated molecules comprising chlorine, plasma activated molecules comprising bromine, plasma activated molecules comprising iodine, and any combinations thereof.

8. The method of claim 1, wherein the second etch chemistry is derived from an etch reactant comprising one or more of fluorine, molecules including fluorine, or a combination thereof.

9. The method of claim 1, wherein the second etch chemistry is selected from one or more of fluorine, molecules comprising fluorine, molecules comprising a fluorine ion, radicals comprising fluorine, and any combinations thereof.

10. A method of etching material, the method comprising the steps of:

in a reaction chamber, exposing a material comprising a formula XYZ, wherein X comprises a metal selected from the group consisting of Group 13-16 metals and transition metals, Y comprises a metal selected from the group consisting of Group 13-16 metals and transition metals, and Z is selected from one or more Group 13-16 elements, to a first etch chemistry to form one or more first volatile compounds and a metal-depleted material;

removing the one or more first volatile compounds from the reaction chamber;

repeating the exposing a material comprising a formula XYZ and the removing the one or more first volatile compounds steps;

exposing the metal-depleted material to a second etch chemistry to react with the metal-depleted material to form one or more second volatile compounds; and removing the one or more second volatile compounds.

11. The method of claim 10, wherein X comprises a metal selected from the group consisting of aluminum, boron, and gallium.

12. The method of claim 10, wherein Y comprises a metal selected from the group consisting of titanium and tantalum.

13. The method of claim 10, wherein X is aluminum and Y is titanium.

14. The method of claim 10, further comprising repeating the steps of exposing a material, removing the one or more first volatile compounds, exposing the metal-depleted material to a second etch chemistry, and removing the one or more second volatile compounds, until a desired amount of the material is removed.

15. The method of claim 10, wherein the first etch chemistry is derived from an etch reactant comprising one or more of chlorine, bromine, iodine, molecules including chlorine, molecules including bromine, molecules including iodine, or any combination thereof.

16. The method of claim 10, wherein the second etch chemistry is derived from an etch reactant comprising one or more of fluorine, molecules including fluorine, or a combination thereof.

17. The method of claim 1, further comprising a step of determining whether a desired amount of material is treated.

18. The method of claim 17, further comprising a step if the desired amount of material has not been treated, repeating the steps of exposing a material comprising a formula XYZ and removing the one or more first volatile compounds.

19. The method of claim 1, wherein X comprises aluminum and Y comprises titanium.

20. The method of claim 10, wherein X comprises aluminum and Y comprises titanium.

\* \* \* \* \*